US012803555B2

(12) United States Patent
Cvejanovic

(10) Patent No.: US 12,803,555 B2
(45) Date of Patent: Nov. 17, 2026

(54) CLOCK SIGNAL DETECTION CIRCUIT, CORRESPONDING ELECTRONIC DEVICE AND METHOD OF OPERATION

(71) Applicant: STMicroelectronics International N.V., Geneva (CH)

(72) Inventor: Dorde Cvejanovic, Munich BY (DE)

(73) Assignee: STMicroelectronics International N.V., Geneva (CH)

( * ) Notice: Subject to any disclaimer, the term of this patent is extended or adjusted under 35 U.S.C. 154(b) by 62 days.

(21) Appl. No.: 18/938,809

(22) Filed: Nov. 6, 2024

(65) Prior Publication Data

US 2025/0158617 A1 May 15, 2025

(30) Foreign Application Priority Data

Nov. 9, 2023 (IT) ........................ 102023000023616

(51) Int. Cl.
*H03K 19/17736* (2020.01)
*H03K 19/0185* (2006.01)
*H03K 19/20* (2006.01)

(52) U.S. Cl.
CPC ... *H03K 19/1774* (2013.01); *H03K 19/01855* (2013.01); *H03K 19/20* (2013.01)

(58) Field of Classification Search
CPC ......... H03K 19/1774; H03K 19/01855; H03K 19/20; H03K 5/26; H03K 5/19
See application file for complete search history.

(56) References Cited

U.S. PATENT DOCUMENTS 4,374,361 A * 2/1983 Holden ................ G01R 29/033 377/16
4,446,437 A 5/1984 Rinaldi
2005/0140398 A1* 6/2005 Daijo ........................ G06F 1/08 327/99
2008/0238508 A1* 10/2008 Jing ........................ H03L 7/143 327/159

FOREIGN PATENT DOCUMENTS

KR 950021782 U 7/1995

OTHER PUBLICATIONS

IT Search Report and Written Opinion for priority application, IT Appl. No. 102023000023616, report dated May 24, 2024, 13 pgs.

* cited by examiner

*Primary Examiner* — Daniel D Chang
(74) *Attorney, Agent, or Firm* — Crowe & Dunlevy LLC

(57) ABSTRACT

A clock signal detection circuit includes a first input that receives an always-on clock signal, and a second input that receives an activatable clock signal. A detection flip-flop circuit has a data input terminal that receives an always-high logic signal, a clock terminal that receives the always-on clock signal, a reset terminal that receives a reset signal, and a data output terminal that produces an asynchronous clock detection signal. The reset signal is asserted to reset the detection flip-flop circuit in response to the activatable clock signal being asserted, and the reset signal is de-asserted to prevent reset of the detection flip-flop circuit in response to the activatable clock signal being de-asserted. The asynchronous clock detection signal is passed to an output to provide a clock detection signal that is asserted to indicate that the activatable clock signal is absent.

17 Claims, 2 Drawing Sheets

CLOCK SIGNAL DETECTION CIRCUIT, CORRESPONDING ELECTRONIC DEVICE AND METHOD OF OPERATION

PRIORITY CLAIM

This application claims the priority benefit of Italian Application for Patent No. 102023000023616 filed on Nov. 9, 2023, the content of which is hereby incorporated by reference in its entirety to the maximum extent allowable by law.

TECHNICAL FIELD

The description relates to circuits configured to detect the presence of a clock signal (or, more generally, any kind of digital signal), and corresponding methods of operation.

Such clock signal detection circuits may be applied to any kind of electronic device that includes a digital circuit (e.g., digital logic) with multiple independent clock sources, in consumer products (e.g., smart phones) or in any other type of application.

BACKGROUND

In digital circuits that include more than one clock domain, it may be desirable to detect if one of the clock sources is present (e.g., properly working and active) or not. For instance, potential scenarios where clock signal detection is useful include a communication started in a first clock domain that requests a response from a second clock domain, and an event detection generated in a first clock domain that requests a response from a second clock domain. If the second clock signal (which may be selectively activatable or switchable) is not present and/or is switching on/off, it can cause problems in the first clock domain, such as communication delay, communication freezing, and metastability of the digital sequential cells.

United States Patent Application Publication No. 2022/0337230, incorporated herein by reference, discloses a phase-locked loop (PLL) circuit that includes a frequency divider circuit. The frequency divider circuit has a reset synchronization unit that synchronizes an external reset signal with an input clock signal to produce a synchronized reset signal. In order to do so, the reset synchronization unit includes three static D flip-flops (DFFs) and an inverter. The inverter produces the complement of the reset signal. The complement of the reset signal is used as an asynchronous reset for the three flip-flops. The three flip-flops receive the clock signal at their clock terminals. The three flip-flops have their data input and data output terminals connected in series to form a chain, and the first flip-flop receives an always-high logic signal at its data input terminal. Therefore, when the level of the reset signal is high, this signal is inverted by the inverter, and a low-level signal is input to the reset terminals of the three flip-flops. At this time, the level of the output terminal of each of the three flip-flops is reset to the low level. When the reset signal changes from the high level to the low level, the initial state is released. Thus, a high-level signal is input to the reset terminals of the flip-flops, and the initial state of the reset synchronization unit is released. At this time, the initial state of the PLL is also released, and the operation is started.

U.S. Pat. No. 8,890,594 also discloses a reset synchronization circuit that synchronizes a reset signal generated in a first clock domain with the clock signal of a second clock domain.

Other references of possible interest in this technological field include United States Patent Application Publication Nos. 2017/0187362, 2019/0372561, and 2018/0054193.

Clock detection circuits known in the art may turn out to occupy a too large silicon area and/or consume too much power, or may be applicable only if the clock signal of the always-on clock domain is faster (i.e., at a higher frequency) than the clock signal of the switchable clock domain, or may be applicable only in cases where communication delay between the two clock domains is acceptable.

Therefore, there is a need in the art to provide improved clock detection circuits that facilitate solving one or more of the issues mentioned above.

There is a need in the art to provide improved clock detection circuits.

SUMMARY

One or more embodiments may relate to a clock detection circuit.

One or more embodiments may relate to a corresponding electronic device (e.g., a logic device having multiple clock domains that exchange signals between each other).

One or more embodiments may relate to a corresponding method of operation.

According to an aspect of the present description, a clock signal detection circuit includes a first input configured to receive an always-on clock signal, a second input configured to receive an activatable clock signal, and an output configured to produce a clock detection signal. A detection flip-flop circuit has a data input terminal configured to receive an always-high logic signal, a clock terminal configured to receive the always-on clock signal, a reset terminal configured to receive a reset signal, and a data output terminal configured to produce an asynchronous clock detection signal. The reset signal is asserted to reset the detection flip-flop circuit in response to the activatable clock signal being asserted, and the reset signal is de-asserted to prevent reset of the detection flip-flop circuit in response to the activatable clock signal being de-asserted. The asynchronous clock detection signal is passed to the output (e.g., directly or through a synchronizer flip-flop pair) to provide the clock detection signal. The clock detection signal is thus asserted to indicate that the activatable clock signal is absent.

One or more embodiments may thus provide a low-area and low-power clock signal detection circuit, which can operate when the always-on clock signal is slower than the switchable clock signal.

According to another aspect of the present description, an electronic device includes a first logic circuit clocked by an always-on clock signal, a second logic circuit clocked by an activatable clock signal, and a communication interface coupled to the first logic circuit and to the second logic circuit. The communication interface is configured to pass a request signal from the first logic circuit towards the second logic circuit and to pass an acknowledge signal from the second logic circuit towards the first logic circuit. The first logic circuit includes a clock signal detection circuit according to one or more embodiments. The clock signal detection circuit is configured to detect absence of the activatable clock signal, and the communication interface is configured to automatically react on the absence of the activatable clock signal.

According to another aspect of the present description, a method of operating a clock signal detection circuit or an electronic device according to one or more embodiments includes: receiving an always-on clock signal at the first input of the clock signal detection circuit; receiving an activatable clock signal at the second input of the clock signal detection circuit; receiving an always-high logic signal at the data input terminal of the detection flip-flop circuit; receiving the always-on clock signal at the clock terminal of the detection flip-flop circuit; asserting a reset signal to reset the detection flip-flop circuit in response to the activatable clock signal being asserted; de-asserting the reset signal to prevent reset of the detection flip-flop circuit in response to the activatable clock signal being de-asserted; receiving the reset signal at the reset terminal of the detection flip-flop circuit; producing an asynchronous clock detection signal at the data output terminal of the detection flip-flop circuit; and passing the asynchronous clock detection signal to the output of the clock signal detection circuit (e.g., directly or through a synchronizer circuit) to produce a clock detection signal.

BRIEF DESCRIPTION OF THE DRAWINGS

One or more embodiments will now be described, by way of example, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

In an electronic device that includes more than one independent clock source, where one of the clock sources is not constantly present (e.g., one of the clock sources in selectively activatable, or switchable on/off), a desirable functionality of the electronic device is that of detecting the presence of the switchable clock signal. This scenario may be better understood by referring initially to FIGS. 1 and 2 as an introduction.

Figure 1:
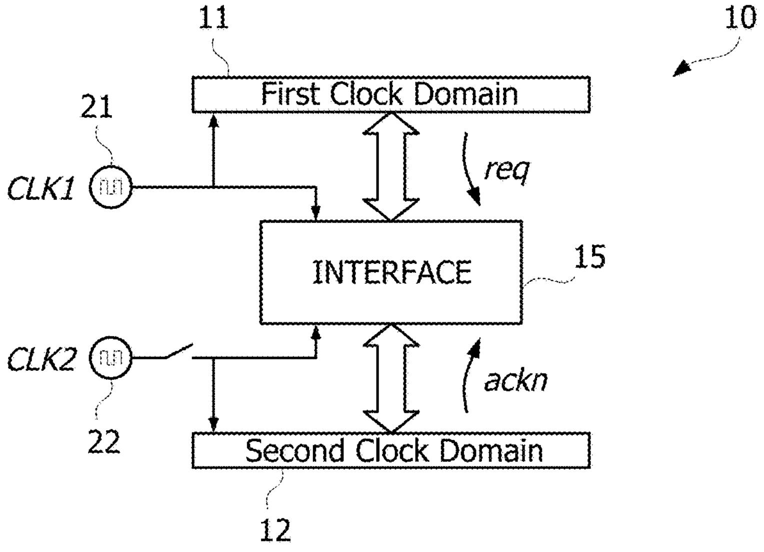
FIG. 1 is a circuit block diagram of an electronic device including multiple clock domains that communicate with each other, which is an exemplary scenario where a clock detection circuit may be applied.
Figure 2:
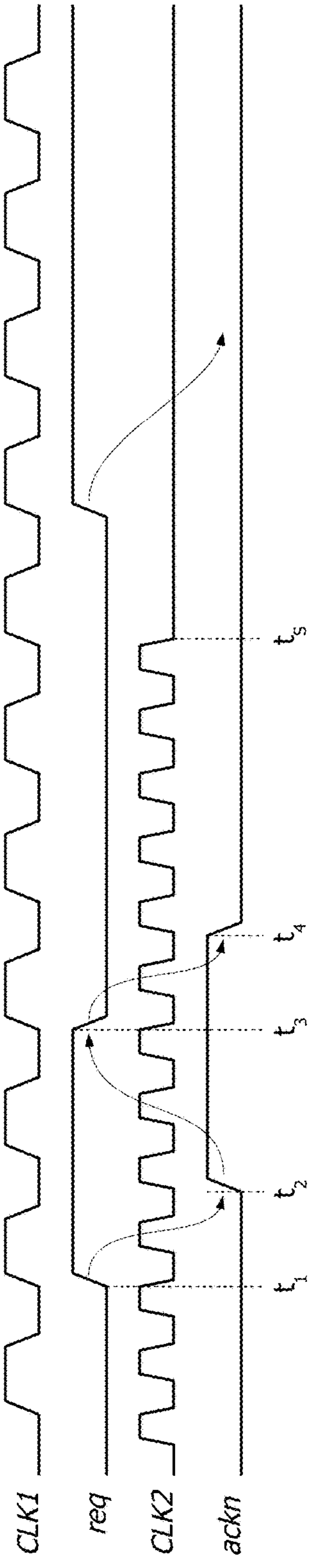
FIG. 2 is a time diagram including waveforms exemplary of signals in the electronic device of FIG. 1.

FIG. 1 is a circuit block diagram exemplary of an electronic device including multiple clock domains that communicate with each other, and FIG. 2 is a time diagram including waveforms exemplary of signals in the device of FIG. 1. The electronic device 10 includes digital logic, and in particular it includes a first clock domain 11 (e.g., a bus matrix) where an always-on clock signal CLK1 is used, and second clock domain 12 (e.g., a bus matrix) where a switchable clock signal CLK2 is used. In this context, an "always-on" clock signal refers to a clock signal that is constantly being supplied to domain 11 when the device is powered, and a "switchable" clock signal refers to a clock signal that selectively applied, or not, to domain 11 when the device is powered. The clock signals CLK1 and CLK2 may be received by the clock domains 11 and 12 from external sources (e.g., clock generators 21 and 22, respectively) as exemplified in FIG. 1, or may be produced internally by the digital circuits 11 and 12. As exemplified in FIG. 1, the two clock domains 11 and 12 may be coupled by a communication interface such as an asynchronous bridge 15, which may pass a request signal req from domain 11 towards domain 12 and an acknowledge signal ackn from domain 12 towards domain 11.

As exemplified in FIG. 2, communication between the clock domains 11 and 12 works correctly as long as the switchable clock signal CLK2 is present (i.e., is being selectively applied; e.g., until time $t_S$ in FIG. 2), assuming that the clock signal CLK1 is always present. In this example, the request signal req is asserted in the first clock domain 11 at time $t_1$, and the acknowledge signal ackn is consequently asserted in the second clock domain 12 at time $t_2$, so that the request can be correctly processed at times $t_3$ and $t_4$. On the other hand, if the switchable clock signal CLK2 is not present (i.e., is not being selectively applied; e.g., deactivated-past time $t_S$ in FIG. 2), the acknowledge signal ackn cannot be asserted in the second clock domain 12 in response to assertion of the request signal req from the first clock domain 11, and the communication is stuck (e.g., frozen). This example illustrates why it may be desirable to detect whether the switchable clock signal CLK2 is actually present or not in connection with engaging in communications between domains 11 and 12. By detecting whether the switchable clock signal CLK2 is present, communication between the two clock domains 11 and 12 (i.e., the always-on domain and the switchable domain) will not freeze when the switchable clock signal CLK2 is not present. For instance, the communication logic (e.g., the asynchronous bridge 15) may use the information about the presence of the switchable clock signal CLK2 to decide how to respond on a communication request coming from the always-on domain 11 (e.g., automatically acknowledge or reject the request).

An approach to the issue of clock signal detection may rely on the implementation of a counter circuit in the switchable clock domain 12. The counter increases its count number at each pulse of the switchable clock signal CLK2. The counter is regularly sampled (and cleared) by some detection circuitry in the always-on domain 11 to detect whether the switchable clock signal CLK2 is still running. However, such an approach may result in a large silicon area occupation and/or a large current consumption.

In the cases where the switchable clock signal CLK2 is much slower than the always-on clock signal CLK1, another approach to the issue of clock signal detection may rely on sampling the switchable clock signal CLK2 using a conventional synchronizer, so that rising and/or falling edges of the switchable clock signal can be detected. However, this approach does not work if the always-on clock signal CLK1 is slower than the switchable clock signal CLK2, which is usually the case in low-power devices.

In the cases where the switchable clock domain 12 can request to switch off its clock signal CLK2, wait for an acknowledge from the always-on clock domain 11 and then actually switch off the clock signal CLK2, a handshake mechanism may be implemented. However, this approach is feasible if the switching on/switching off of the clock signal CLK2 can be delayed until the acknowledge from the always-on clock domain 11 is received, which is not always the case. In fact, sometimes the application has no control over the switchable clock signal CLK2.

Figure 3:
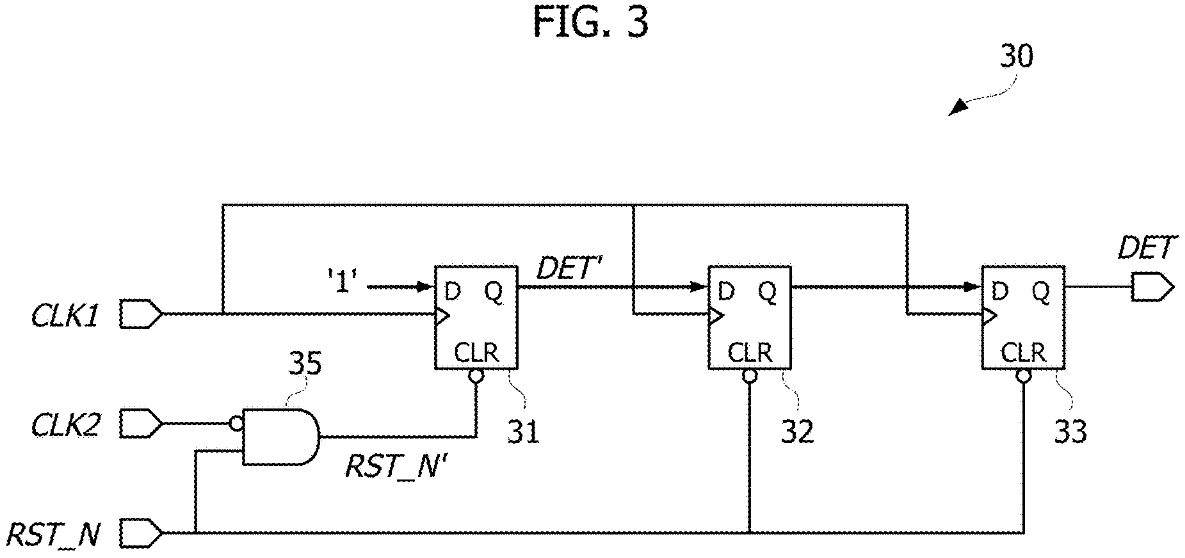
FIG. 3 is a circuit block diagram of a clock detection circuit.

Therefore, there is a need in the art to provide improved clock detection circuits. In this respect, FIG. 3 is a circuit block diagram exemplary of a clock signal detection circuit 30 that aims at solving one or more of the above-mentioned shortcomings of the prior solutions, and can be implemented in any digital device having multiple clock domains (e.g., implemented in an always-on clock domain to detect the presence of the clock signal of a switchable clock domain).

In particular, the clock detection circuit 30 has an input node, terminal or pin configured to receive an always-on clock signal CLK1, an input node terminal or pin configured to receive a switchable clock signal CLK2, and an input node, terminal or pin configured to receive a reset signal RST_N (e.g., an active-low reset signal). Furthermore, the clock detection circuit 30 has an output node, terminal or pin configured to produce a clock detection signal DET, which is asserted (e.g., set to a high logic value, logic '1') to indicate that the switchable clock signal CLK2 is not present, and is de-asserted (e.g., set to a low logic value, logic '0') otherwise. To this aim, the clock detection circuit 30 includes a D flip-flop circuit 31 (i.e., a digital sequential circuit that uses edges of a clock signal to store the data received at its input) that has a data input terminal D configured to receive an always-high logic signal (i.e., a voltage signal whose value is interpreted as a logic '1' by the flip-flop 31, such as a digital supply voltage Vdd). Further, the flip-flop 31 has a clock terminal configured to receive the always-on clock signal CLK1, a (complemented) reset or clear terminal CLR configured to receive a gated reset signal RST_N' (e.g., active-low), and a data output terminal Q configured to produce an asynchronous clock detection signal DET'. The clock detection circuit 30 may include a combinational logic circuit, implemented here, by example, as a logic gate 35, configured to produce the gated reset signal RST_N' as a function of the input reset signal RST_N and the switchable clock signal CLK2. In particular, the gated reset signal RST_N' is equal to the input reset signal RST_N if the switchable clock signal CLK2 is de-asserted (e.g., logic low), and is steadily set to a low logic level (e.g., logic '0') if the switchable clock signal CLK2 is asserted (e.g., logic high). For instance, the logic gate 35 may include an AND logic gate that combines the input reset signal RST_N and the complement of the switchable clock signal CLK2 to produce the gated reset signal RST_N'. It will be noted that the logic gate 35 may be implemented differently depending on the polarity of the logic circuit: for instance, the logic gate 35 may include an OR logic gate if the clear signal of the detection flip-flop 31 is active on the high level.

Figure 4:
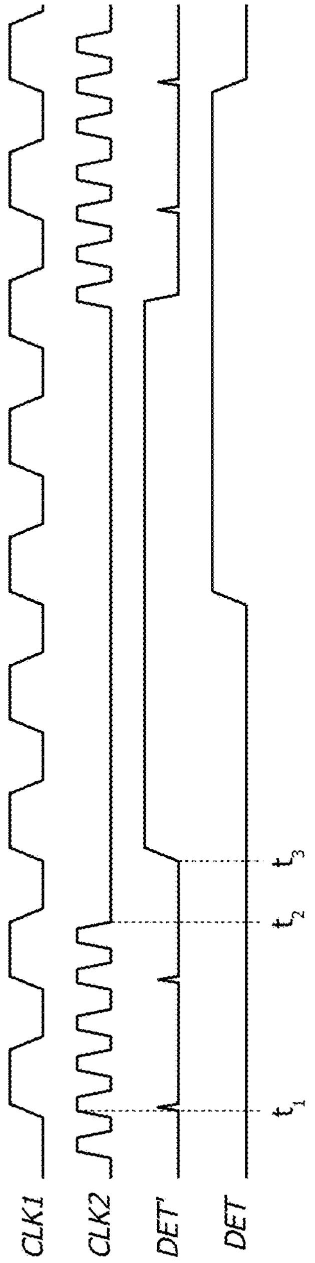
FIG. 4 is a time diagram including waveforms exemplary of signals in the clock detection circuit of FIG. 3.

Operation of the logic gate 35 and flip-flop 31 may be better explained referring to the waveforms of signals CLK1, CLK2 and DET' exemplified in FIG. 4. Substantially, the high logic level of the switchable clock signal CLK2 is used as an asynchronous reset of the detection flip-flop 31. As long as the switchable clock signal CLK2 is present and thus it is periodically asserted (with a frequency higher than the frequency of the always-on clock signal CLK1), it periodically resets the detection flip-flop 31. In fact, following a rising edge of signal CLK1 (see, e.g., time $t_1$ in FIG. 4), the detection flip-flop 31 samples the always-high signal at its data input terminal D, but it also gets immediately reset by a rising edge of signal CLK2, so that the asynchronous detection signal DET' remains de-asserted (e.g., logic low), possibly with a small spike whose duration is not sufficient to be detected by subsequent logic circuitry. Note that assertion of signal CLK2 implies de-assertion of the gated reset signal RST_N', and that the clear terminal CLR of flip-flop 31 is complemented (in other words, the gated reset signal RST_N' is used as an active-low reset signal). Thus, as long as signal CLK2 is present, the asynchronous detection signal DET' remains de-asserted to indicate that the switchable clock signal CLK2 is present. Conversely, when the switchable clock signal CLK2 is off (i.e., not present, steadily at a low logic level-see the time interval that follows time $t_2$ in FIG. 4), the logic gate 35 becomes transparent for signal RST_N, which means that the reset of the detection flip-flop 31 is released (i.e., flip-flop 31 gets reset only if the external reset signal RST_N so demands). As a result, the detection flip-flop 31 samples the always-high signal ('1') at its input data terminal D at each pulse of the always-on clock signal CLK1, and the asynchronous detection signal DET' gest consequently asserted to indicate that the switchable clock signal CLK2 is not present (see time $t_3$ in FIG. 4).

It will be noted that the logic gate 35 may even be absent from the clock detection circuit, if the clock detection circuit does not receive an external reset signal RST_N. In such a case, it would be sufficient to pass the switchable clock signal CLK2 to the reset or clear terminal CLR of flip-flop 31 with a compatible polarity (i.e., pass signal CLK2 if the reset of flip-flop 31 is triggered by a high logic level, or pass the complement of signal CLK2 if the reset of flip-flop 31 is triggered by a low logic level).

Therefore, in one or more embodiments a clock detection circuit may include substantially a single detection flip-flop 31 and optionally a gating circuit 35 as previously discussed. However, in this case the asynchronous clock detection signal DET' is asserted at the first "useful" rising edge of the always-on clock signal CLK1 (i.e., the first rising edge that follows the deactivation of the switchable clock signal CLK2). A further improved solution, and in particular a solution that is clean with respect to clock domain crossing (CDC) and reset domain crossing (RDC), may include additional synchronization flip-flops 32 and 33 as exemplified in FIG. 3.

Substantially, flip-flops 32 and 33 operate as a synchronizer towards the destination always-on clock domain. Flip-flops 32 and 33 are arranged in series between the output of flip-flop 31 and the output node, terminal or pin of the clock detection circuit 30. In particular, a first synchronization flip-flop 32 has a data input terminal D configured to receive the asynchronous clock detection signal DET', a clock terminal configured to receive the always-on clock signal CLK1, a (complemented) reset or clear terminal CLR configured to receive the external reset signal RST_N, and a data output terminal Q configured to pass its output to the second synchronization flip-flop 33. The second synchronization flip-flop 33 has a data input terminal D configured to receive the output from the first synchronization flip-flop 32, a clock terminal configured to receive the always-on clock signal CLK1, a (complemented) reset or clear terminal CLR configured to receive the external reset signal RST_N, and a data output terminal Q configured to produce a synchronous detection signal DET at the output node, terminal or pin of the clock detection circuit 30.

Therefore, one or more embodiments provide a clock detection circuit that includes only one detection flip-flop 31 and a logic gate 35 and allows detection when the detected clock signal is faster (i.e., at higher frequency) than the clock signal of the detecting clock domain. The clock detection circuit may additionally include synchronization flip-flops 32 and 33 (e.g., two synchronization flip-flops). The detection circuit 30 is thus very small and occupies a small silicon area. Further, such a small circuitry running on a slow clock signal CLK1 also results in very low power consumption. As an additional advantage, the presence of the switchable clock signal CLK2 is detected in a fast and reliable manner: the information about the switchable clock signal CLK2 is available after just two clock cycles of the destination (always-on) clock signal CLK1.

Using a clock detection circuit 30 as exemplified in FIG. 3, any application can use the information about the presence (or not) of the switchable clock signal CLK2 to properly react on requests from the always-on clock domain, even when the switchable clock signal is not present. This is exemplified in FIG. 5, which shows waveforms exemplary of signals in a communication device 10 as exemplified in FIG. 1, where a clock detection circuit 30 is implemented in the always-on clock domain 11. Here, it is shown that as long as the switchable clock signal CLK2 is present (i.e., is being selectively applied; e.g., until time $t_S$ in FIG. 5) the communication works fine, with assertion of the request signal req (see time $t_1$ in FIG. 5), the consequent assertion of the acknowledge signal ackn (see time $t_2$ in FIG. 5), and processing of the request (see times $t_3$ and $t_4$ in FIG. 5). On the other hand, if the switchable clock signal CLK2 is not present (i.e., is not being selectively applied; e.g., deactivated-past time $t_S$ in FIG. 5) and the always-on clock domain 11 is aware of this condition by sensing a currently asserted value of the clock detection signal DET (or, as exemplified in FIG. 5, a currently de-asserted value of the complement DET_N of the clock detection signal DET), an automatic acknowledge (or rejection) may be implemented immediately in response to a request by the always-on clock domain (see time $t_S$ in FIG. 5).

Figure 5:
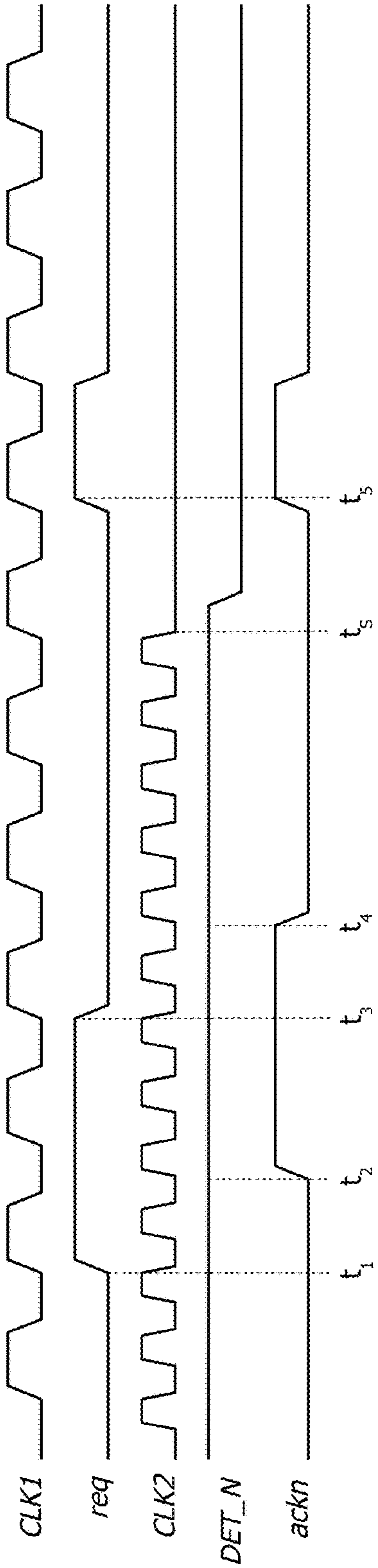
FIG. 5 is a time diagram including waveforms exemplary of signals in the electronic device of FIG. 1 when using a clock detection circuit.

It is noted that the application example discussed with reference to FIGS. 1 and 5 is not a limiting one, and that a clock detection circuit according to one or more embodiments may be used for any other type of application where it is desired to detect the presence of a clock signal. Furthermore, one or more embodiments may be applied to the detection of signals other than clock signals. For instance, one or more embodiments may be used as detectors for the high/low level of any digital signal, provided that the signal to be detected is connected to the clear or reset terminal of the detection flip-flop (directly or inverted).

Without prejudice to the underlying principles, the details and embodiments may vary, even significantly, with respect to what has been described by way of example, without departing from the extent of protection.

The claims are an integral part of the technical teaching provided herein in respect of the embodiments.

The extent of protection is determined by the annexed claims.

The invention claimed is:

1. A clock signal detection circuit, comprising:

a first input configured to receive an always-on clock signal;

a second input configured to receive an activatable clock signal;

a third input configured to receive an external reset signal;

an output configured to produce a clock detection signal;

a detection flip-flop circuit having a data input terminal configured to receive an always-high logic signal, a clock terminal configured to receive the always-on clock signal, a reset terminal configured to receive a reset signal, and a data output terminal configured to produce an asynchronous clock detection signal;

a logic circuit configured to produce said reset signal by asserting said reset signal to reset said detection flip-flop circuit in response to said activatable clock signal being asserted, and de-asserting said reset signal to prevent reset of said detection flip-flop circuit in response to said activatable clock signal being de-asserted, and passing said external reset signal as the reset signal in response to said activatable clock signal being de-asserted; and wherein said asynchronous clock detection signal is passed to said output to provide said clock detection signal which is asserted when said activatable clock signal is absent.

2. The clock signal detection circuit of claim 1, wherein said logic circuit comprises an AND logic gate configured to combine said external reset signal and a complement of said activatable clock signal to produce said reset signal.

3. The clock signal detection circuit of claim 1, wherein said logic circuit comprises an OR logic gate configured to combine said external reset signal and a complement of said activatable clock signal to produce said reset signal.

4. The clock signal detection circuit of claim 1, further comprising:

a first synchronization flip-flop circuit having a data input terminal configured to receive said asynchronous clock detection signal, a clock terminal configured to receive said always-on clock signal, and a data output terminal configured to produce a first synchronous clock detection signal;

wherein said first synchronous clock detection signal is passed to said output to provide said clock detection signal.

5. The clock signal detection circuit of claim 4, further comprising a third input configured to receive an external reset signal, wherein said first synchronization flip-flop circuit has a reset terminal configured to receive the external reset signal.

6. The clock signal detection circuit of claim 1, further comprising:

a first synchronization flip-flop circuit having a data input terminal configured to receive said asynchronous clock detection signal, a clock terminal configured to receive said always-on clock signal, and a data output terminal configured to produce a first synchronous clock detection signal;

a second synchronization flip-flop circuit having a data input terminal configured to receive said first synchronous clock detection signal, a clock terminal configured to receive said always-on clock signal, and a data output terminal configured to produce a second synchronous clock detection signal;

wherein said second synchronous clock detection signal is passed to said output to provide said clock detection signal.

7. The clock signal detection circuit of claim 6, further comprising a third input configured to receive an external reset signal, wherein reset terminals of said first synchronization flip-flop circuit and said second synchronization flip-flop circuit are configured to receive the external reset signal.

8. An electronic device, comprising:

a first logic circuit clocked by an always-on clock signal;

a second logic circuit clocked by an activatable clock signal;

a communication interface coupled to said first logic circuit and to said second logic circuit and configured to pass a request signal from the first logic circuit towards the second logic circuit and to pass an acknowledge signal from the second logic circuit towards the first logic circuit;

wherein said first logic circuit comprises a clock signal detection circuit comprising:

a first input configured to receive said always-on clock signal;

a second input configured to receive said activatable clock signal;

an output configured to produce a clock detection signal;

a detection flip-flop circuit having a data input terminal configured to receive an always-high logic signal, a clock terminal configured to receive the always-on clock signal, a reset terminal configured to receive a reset signal, and a data output terminal configured to produce an asynchronous clock detection signal;

wherein said reset signal is asserted to reset said detection flip-flop circuit in response to said activatable clock signal being asserted, and said reset signal is de-asserted to prevent reset of said detection flip-flop circuit in response to said activatable clock signal being de-asserted; and wherein said asynchronous clock detection signal is passed to said output to provide said clock detection signal which is asserted when said activatable clock signal is absent; and wherein said communication interface is configured to automatically react on the absence of said activatable clock signal.

9. The electronic device of claim 8, wherein said first logic circuit is configured to receive said always-on clock signal from a first external clock generator, and said second logic circuit is configured to receive said activatable clock signal from a second external clock generator.

10. The electronic device of claim 8, wherein said first logic circuit is configured to produce said always-on clock signal and said second logic circuit is configured to produce said activatable clock signal.

11. The electronic device of claim 8, wherein the clock signal detection circuit further comprises:

a third input configured to receive an external reset signal; and a combinational logic circuit configured to produce said reset signal by asserting said reset signal in response to said activatable clock signal being asserted, and passing said external reset signal in response to said activatable clock signal being de-asserted.

12. The electronic device of claim 11, wherein said combinational logic circuit comprises an AND logic gate configured to combine said external reset signal and a complement of said activatable clock signal to produce said reset signal.

13. The electronic device of claim 11, wherein said combinational logic circuit comprises an OR logic gate configured to combine said external reset signal and a complement of said activatable clock signal to produce said reset signal.

14. A method of operating a clock signal detection circuit, the method comprising:

receiving an always-on clock signal at a first input of the clock signal detection circuit;

receiving an activatable clock signal at a second input of the clock signal detection circuit;

receiving an external reset signal at a third input;

receiving an always-high logic signal at a data input terminal of a detection flip-flop circuit;

receiving the always-on clock signal at a clock terminal of said detection flip-flop circuit;

receiving a reset signal at a reset terminal of said detection flip-flop circuit;

asserting the reset signal to reset said detection flip-flop circuit in response to said activatable clock signal being asserted;

de-asserting said reset signal to prevent reset of said detection flip-flop circuit in response to said activatable clock signal being de-asserted;

passing said external reset signal as the reset signal in response to said activatable clock signal being de-asserted;

producing an asynchronous clock detection signal at a data output terminal of said detection flip-flop circuit; and passing said asynchronous clock detection signal to an output of the clock signal detection circuit to produce a clock detection signal;

whereby said clock detection signal is asserted to indicate that said activatable clock signal is absent.

15. The method of claim 14, further comprising logically combining the activatable clock signal and the external reset signal to generate the reset signal.

16. The method of claim 15, wherein logically combining comprises logically ANDing said external reset signal and a complement of said activatable clock signal to produce said reset signal.

17. The method of claim 15, wherein logically combining comprises logically ORing said external reset signal and a complement of said activatable clock signal to produce said reset signal.

* * * * *